United States Patent [19]

Yonezu et al.

[11] 4,282,494

[45] Aug. 4, 1981

[54] STRIPE-GEOMETRY DOUBLE HETEROJUNCTION LASER ELEMENT

[75] Inventors: Hiroo Yonezu; Masayasu Ueno, both of Tokyo, Japan

[73] Assignee: Nippon Electric Co., Ltd., Tokyo, Japan

[21] Appl. No.: 15,839

[22] Filed: Feb. 27, 1979

[30] Foreign Application Priority Data

Feb. 28, 1978 [JP] Japan .................................. 53-23115

[51] Int. Cl.$^3$ .............................................. H01S 3/19
[52] U.S. Cl. .............................................. 331/94.5 H
[58] Field of Search ................... 331/94.5 H; 357/16, 357/17, 18

[56] References Cited

U.S. PATENT DOCUMENTS 3,824,493  7/1974  Hakki .............................. 331/94.5 H
4,105,955  8/1978  Hayashi et al. .................. 331/94.5 H Primary Examiner—James W. Davie Attorney, Agent, or Firm—Sughrue, Rothwell, Mion, Zinn and Macpeak

[57] ABSTRACT

In a double heterojunction semiconductor laser, extremely high optical power density emission is achieved by forming a stripe-geometry exciting region in an active layer so as not to be exposed on the opposite reflective surfaces, and selecting a band gap of the stripe-geometry exciting region narrower than that of surrounding non-exciting region of the active layer. A pair of window regions formed between the respective reflective surfaces and the tip ends of the stripe-geometry exciting region are sandwiched between a pair of heterojunction interfaces and thus acting low loss optical waveguides. In addition, by providing an optical obstacle region in the vicinity of the window region, higher order modes in horizontal transverse mode oscillations are suppressed, and thereby extremely high optical power output at the fundamental mode can be obtained without causing catastrophic optical damage on the reflective surfaces.

6 Claims, 8 Drawing Figures

STRIPE-GEOMETRY DOUBLE HETEROJUNCTION LASER ELEMENT

BACKGROUND OF THE INVENTION

The present invention relates to a semiconductor laser element, and more particularly to a stripe-geometry double heterojunction (DH) laser element which has higher order transverse mode oscillations suppressed and provides an extremely high optical output.

Heretofore, various types of double heterojunction laser elements represented by double heterojunctions of (Al.Ga)As series crystals have received attention as a light source for use in optical fiber communications because they readily produce continuous wave (CW) oscillations at room temperature. As is now well known in the art, a double heterostructure portion typically comprises an n-GaAs substrate on which are grown the following expitaxial layers in the order recited: an n-$Al_xGa_{1-x}As$ layer, $x>0$; an n- or p- or compensated $Al_yGa_{1-y}As$ layer, $0 \leq y < x$; and a p-$Al_zGa_{1-z}As$ layer, $z<y$. However, in a stripe-geometry laser having its electrode formed in a stripe shape, especially in an (Al.Ga)As laser having a stripe electrode width of 10~20 μm, a CW optical output of 10 mW and a pulse-operated (pulse width of 100 ns) optical output of 100 mW were the threshold of operations, and if an optical output beyond this threshold is emitted, then one of the reflective surfaces may be easily destroyed. This phenomenon has been known as catastrophic optical damage (COD), and the threshold optical output power density is about 1 $MW/cm^2$. In the prior art, various trials for lowering an optical power output density on a reflective surface have been made for attaining a high optical output. More particularly, enlargement of a stripe electrode width, increase of an active layer thickness, double-double heterostructure (DDH), etc. have been reported. However, in these cases, there was always an associated increase of a threshold current density which made continuous wave oscillation at room temperature difficult. In addition, if the laser is made to operate at a high optical output, then an oscillation region is expanded even though the stripe electrode width is narrow, so that a horizontal transverse mode (a transverse mode in the direction parallel to an active layer) becomes complex multiple modes. Consequently, use of high optical output semiconductor lasers has been limited to detection of obstacles or the like, and new uses such as high optical output light communications, laser printers, etc. have been not realized.

The cause of generation of catastrophic optical damage is conceived as follows: In the conventional semiconductor lasers, an active layer is fully injected and activated up to the neighborhood of reflective surfaces. However, in the close vicinity of each reflective surface, an injected carrier density is lowered as influenced by the surface states, so that the vicinity acts as an absorber for the emitted light. If the optical output is increased, light absorption in the vicinity of each reflective surface increases, resulting in an increase of heat generation or Brillouin scattering, and thus destruction occurs. The reason why the threshold output power densities in the heretofore known lasers in which a high optical output was aimed at as by varying an active layer thickness or by providing a p-n homojunction within a thick active layer, were all about 1 $MW/cm^2$ (pulsed operation), exists in the above-mentioned basis.

In addition, a laser structure for enhancing the threshold optical output for catastrophic optical damage by making the vicinity of one reflective surface as a low loss region for laser light, that is, by not exposing one end of an active layer on the reflective surface, was proposed by B. W. Hakki in U.S. Pat. No. 3,824,493 (July 16, 1974). However, since this structure has a low loss region provided only in the vicinity of one reflective surface, upon high optical output operation the other reflective surface would be subjected to catastrophic optical damage. Furthermore, since an exciting region in an active layer is defined only by a stripe electrode, there is a shortcoming that horizontal transverse mode oscillations would be easily turned to higher order multiple modes.

SUMMARY OF THE INVENTION

It is an object of the present invention to provide a stripe-geometry double heterojunction semiconductor element that is free from catastrophic optical damage in which rise of a threshold current is suppressed and even upon high optical output a fundamental horizontal transverse mode is stabilized.

A stripe-geometry double heterojunction laser element according to the present invention is featured in that non-exciting regions having a wider band gap than that of a stripe-geometry light emitting region are extended between the tip ends of the stripe-geometry light emitting region and respective reflective surfaces and are sandwiched between a pair of heterojunction interfaces, and in addition, optical obstacles for impeding higher order horizontal transverse modes are provided within an active layer in at least one of the non-exciting regions.

According to the aforementioned structural feature, the optical obstacles provided in the non-exciting region achieves a similar function to the aperture in the case of gas lasers and thus can easily realize stable fundamental horizontal transverse mode oscillation. In addition, since laser light generating catastrophic optical damage does not exists, a further high optical output (10 times or more as high as the threshold optical output power density in the prior art) can be achieved.

If the optical obstacles are provided in the conventional lasers in which the non-exciting window region does not exist, they will cause deterioration of the laser because the optical obstacles make contact with a current passing region.

BRIEF DESCRIPTION OF THE DRAWINGS

These and other features and advantages of the present invention will become more apparent by reference to the following description of its preferred embodiments taken in conjunction with the accompanying drawings, wherein.

DESCRIPTION OF THE PREFERRED EMBODIMENTS

Figure 1:
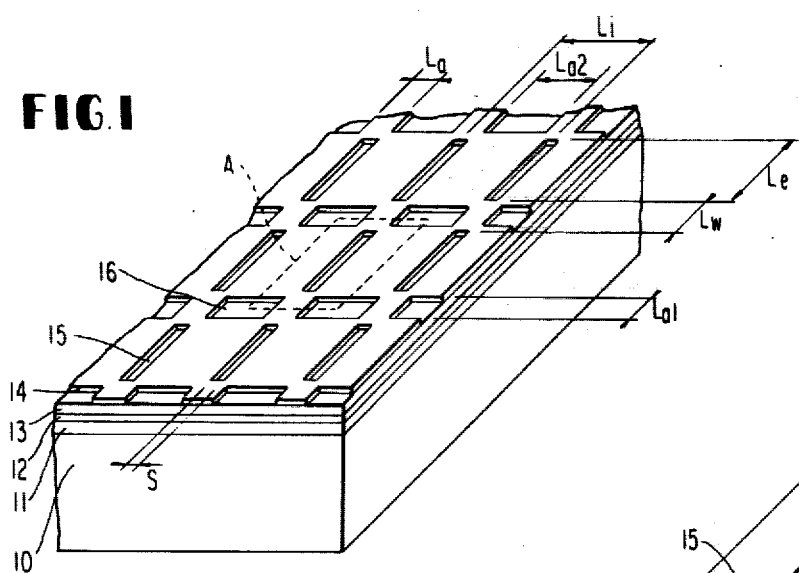
FIG. 1 is a perspective view illustrating the manner in which a large number of laser elements according to the present invention are simultaneously obtained from a single wafer, the wafer being shown as applied with a mask for impurity diffusion.

Referring now to FIG. 1, a semiconductor wafer for manufacturing double heterojunction semiconductor elements comprises, in one preferred embodiment, an n-type GaAs substrate 10 having an n-$Al_{0.7}Ga_{0.7}As$ layer 11 (3 μm in thickness), on GaAs active layer 12 (0.2 μm in thickness, carrier concentration≈$3 \times 10^{18}$ cm$^{-3}$, Te-doped) and an n-$Al_{0.3}Ga_{0.7}As$ layer 13 (2 μm in thickness) formed thereon by liquid phase epitaxy.

Figure 2:
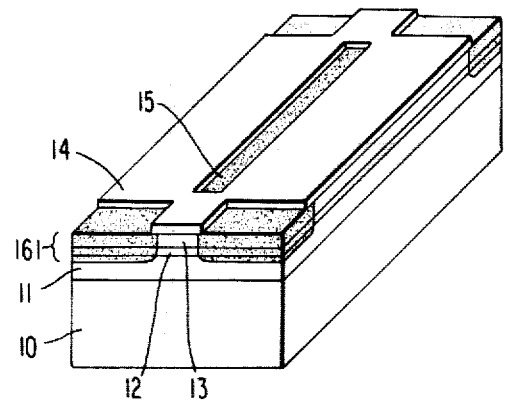
FIG. 2 is an enlarged perspective view of the region encompassed by dash-line frame A in FIG. 1.

On the n-$Al_{0.3}Ga_{0.7}As$ layer 13 is provided silicon dioxide ($SiO_2$) film 14, and openings for use in impurity diffusion are formed in this film 14 by well-known photo-resist techniques. More particularly, stripe-shaped openings 15 corresponding to the stripe-geometry light emitting regions of the respective laser elements and rectangular openings 16 corresponding to the regions serving as optical obstacles are regularly arrayed in rows and columns independently of each other. In the embodiment shown in FIG. 1, each rectangular opening 16 is provided in common to four laser elements. It is to be noted that one laser element corresponds to the section encompassed by dash-line frame A in FIG. 1. According to the present invention, zinc (Zn) is diffused through these openings 15 and 16 to the extent that the diffused zinc may reach the bottom of the active layer 12 or to the extent that it may enter a little into the n-$Al_{0.3}Ga_{0.7}As$ layer 11 as shown in FIG. 2.

Figure 3A:
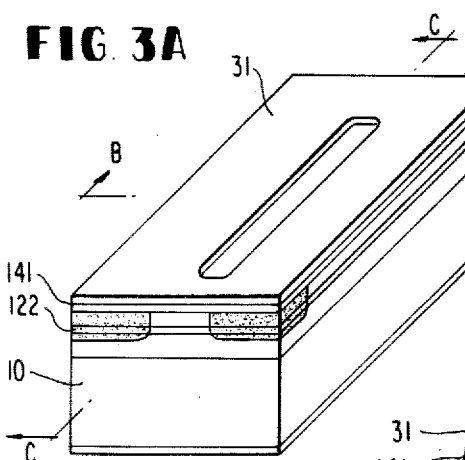
FIG. 3A is a perspective view showing one preferred embodiment of the semiconductor laser element according to the present invention.
Figure 3B:
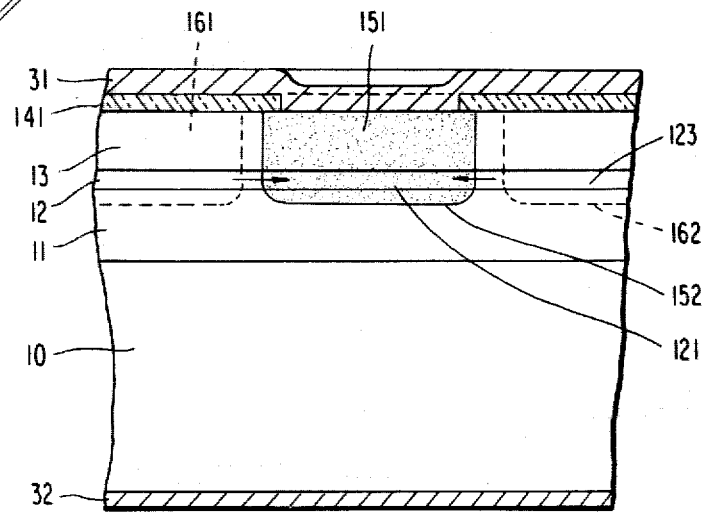
FIG. 3B is a cross-section view taken along line B—B in FIG. 3A.
Figure 3C:
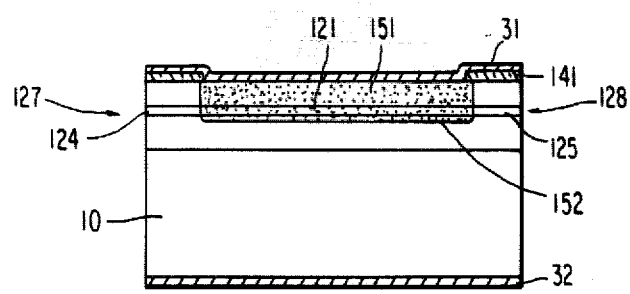
FIG. 3C is another cross-section view taken along line C—C in FIG. 3A.

After the step of diffusion processing, the $SiO_2$ film 14 is removed, a new $SiO_2$ film 141 is provided on the n-$Al_{0.3}Ga_{0.7}As$ layer 13 with only regions corresponding to the stripe-geometry openings 15 in FIG. 1, and a well known p-type ohmic electrode 31 of gold-chromium alloy (Au/Cr) is provided over the entire surface as shown in FIGS. 3A, FIG. 3B and FIG. 3C. On the side of the n-GaAs substrate 10, a well known n-type ohmic electrode 32 of gold-germanium-nickel alloy (Au/Ge/Ni) is formed over the entire surface of the substrate.

As shown in FIG. 3A, FIG. 3B and FIG. 3C, a stripe-geometry diffusion region 151 is formed through the stripe-geometry opening 15, while diffusion regions 161 serving as optical obstacles are formed through the rectangular openings 16, and the diffusion fronts 152 and 162 of these Zn diffusion regions are controlled so as to reach or just pass through the interface between the active layer 12 and the n-$Al_{0.3}Ga_{0.7}As$ layer 11 by a fraction of a micron. The diffused regions 121 and 122 within the active layer 12 having Zn diffused therein have been converted into p-type regions having a carrier concentration of $3\sim8 \times 10^{18}$ cm$^{-3}$, and thus form the so-called impurity-compensated p-type regions.

As is the case with the above-described preferred embodiment, if an n-type active layer 12 is partly converted into an impurity-compensated p-type region, then the band gap of the p-type region is reduced by 15∼50 meV with respect to that of the remaining n-type region. In this case, as the n-type impurity concentration is higher and as the p-type impurity concentration is higher, the magnitude of the relative change of the band gap is so increased. Further details of this effect is disclosed in U.S. Pat. No. 4,105,955 assigned to the same assignee as this application.

Accordingly, if a current is passed through the laser element in the forward direction via the electrodes 31 and 32, then electron injection occurs as indicated by arrows from surrounding n-type regions 123 of the active layer 12 into a stripe-geometry p-type region 121 of the active layer 12 as shown in FIG. 3B, and thereby the stripe-geometry p-type region 121 is excited and light is emitted. Therefore, in the active layer 12, this stripe-geometry p-type region 121 may be called the "light emitting region" and the surrounding n-type region 123 that is not excited may be called the "non-exciting region." The optical obstacle regions 122 having a current passing therethrough impeded by a $SiO_2$ film 141 is located in the "non-exciting region" but spaced apart from the "light emitting region." In addition, for convenience of explanation, as shown in FIG. 3C, a pair of regions 124 and 125 within the "non-exciting regions" intervening between the respective reflective surfaces and tip ends of the light emitting region 121 are specifically called "window regions."

As shown in FIG. 3C, a pair of reflective surfaces 127 and 128 are located at both ends of wider band gap window regions 124 and 125, respectively, and light is emitted in a narrower band gap light emitting region 121 in the central part. Thus, the laser light absorption is very small in parts of the active layer adjacent to reflective surfaces, compaired with that in conventional lasers. As is described in the above embodiment, such laser structure is realized simply in the AlGaAs DH laser with heavily doped n-type window regions and with a heavily over-compensated p-type light emitting region in the active layer. The reason is that the absorption edge in n-type GaAs or AlGaAs shifts to higher energy with an increase in electron concentration due to the Burstein shift, and that the emitting photon energy in over-compensated p-type GaAs or AlGaAs decreases with an increase in impurity concentrations due to the band tailing. The light, emitted from the light emitting region 121, can propagate through the window regions 124 and 125 due to the efficient optical confinement in the double heterostructure, and the transverse modes perpendicular to the junction plane is restricted to the fundamental mode. The double heterostructure window regions, therefore, greatly contribute to the low loss optical waveguide and extremely high optical power density emission.

According to the above case, even if the lengths of the respective window regions are chosen at about 200 μm, increase of the threshold value is as small as about 20%, and it has become apparent that almost no increase would occur if the lengths are short.

Recently, the inventors of this invention discovered that if the window regions are provided respectively on the both reflective surface sides, catastrophic optical damage would not arise even at a light output exceeding 5 times the threshold optical output in the prior art. This discovery conforms with the above-described cause of the catastrophic optical damage. It has also been confirmed that if each window region is longer than a diffusion length (about 5 μm) of the minority carrier measured from a reflective surface then it can sufficiently achieve the aforementioned effect.

In addition, although the similar effects can be obtained even by embedding (Al.Ga)As layers containing Al and having a wider band gap than the light emitting region on the opposite reflective surface sides to form window regions in the manner of not losing the double heterojunction structure, the manufacture becomes complex and laborious. The provision of window regions on the opposite reflective surface sides as employed according to the present invention can be said, as distinguished from the structure of thickening the active layer or the like, to give a structure which can realize an essentially high optical output operation without raising the threshold. However, the above-described structure in which merely the window regions are provided and the light emitting region is not embedded has a shortcoming that upon high optical output operation the horizontal transverse mode oscillation begins to include high order multiple modes.

Therefore, according to the present invention, in order to suppress the higher order modes optical absorption regions are provided in the vicinities of the window region as shown in the above-described embodiment. As one example of the aperture formed in the $SiO_2$ film 14 in FIG. 1, each stripe-geometry opening 15 has a width S=5 $\mu$m and a length Le=250 $\mu$m with an interval of Lw=100 $\mu$m spaced in the lengthwise direction and an interval of Li=200 $\mu$m spaced in the widthwise direction. With regard to the rectangular opening 16, it is a matter of course that the opening configuration should be selected so that its diffusion region 161 may not contact with the diffusion region 151 at the location of the stripe-geometry opening 15, and by way of example, the dimensions of the opening 16 in the lengthwise and widthwise directions of the stripe-geometry opening 15 are respectively set at $La_1=60$ $\mu$m and at $La_2=193$ $\mu$m, so that the longer edge $La_2$ of the opening 16 and the tip end of the stripe opening 15 are spaced apart by $\frac{1}{2}(Lw-La_1)=20$ $\mu$m. In addition, the shorter edges $La_1$ are spaced apart by La=7 $\mu$m with the major axis of the stripe opening 15 located at the center of the interval.

In such a structure, the effective band gap of the light emitting region is reduced by about 40 meV with respect to that of the window regions. Accordingly, the absorption coefficient in the window region is as small as 20–30 cm$^{-1}$ which gives an almost transparent property for the emitted laser light, so that the rise of the threshold caused by existence of the window regions is suppressed within 15%. Thus, fundamental horizontal transverse mode oscillations of about 3 $\mu$m in spot size can be maintained even in an operation at three or more times the threshold. In a pulsed operation, catastrophic optical damage would not occur even at an output exceeding 300 mW, and a CW operation at room temperature at an output of 50 mW can be achieved.

While the above-described preferred embodiment of the invention was explained in connection to the case where the interval between the openings 16 for the obstacle regions was selected at La=7 $\mu$m for the width S=5 $\mu$m of the stripe-geometry opening 15, that is, in connection to the case of S<La, it is a matter of course that the effects of the present invention can be achieved even in the case of S$\geq$La. However, if the interval La is considerably small with respect to the width S, then a shortcoming appears that the threshold of oscillation rises, and so, the interval La cannot be made too small.

On the other hand, if the interval La is too large with respect to the width S, the suppression effect for the higher order modes decreases. However, if the length of the window region is chosen long and the length $La_1$ of the obstacle region is made large, then the suppression effect can be supplemented. This suppression effect for the higher order modes depends upon a light absorption loss in the obstacle region 122, and in the case of Zn diffusion as in the above-described embodiment, the light absorption loss is increased as the concentration becomes higher. Accordingly, in the case of a higher carrier concentration (higher than $10^{19}$ cm$^{-3}$), the same effect can be achieved with a short distance $L_{al}$ as compared to the case of a lower carrier concentration (of the same order as the concentration of the exciting region 121). For instance, if the optical obstacle region 122 is formed by high-concentration Zn diffusion, then the absorption coefficient of 1,000–5,000 cm$^{-1}$ will result and thus the higher order mode suppression can be achieved by providing a length of 10–20 $\mu$m, whereas in the case of low-concentration Zn diffusion, then the absorption coefficient is of the order of 200–300 cm$^{-1}$ and thus a length of 30–100 $\mu$m is necessitated. In the case of etched bores as will be described later, there exists the absorption coefficient of greater than 10,000 cm$^{-1}$, so that a length of at most 2–3 $\mu$m is sufficient, and also in the case of relying upon proton irradiation, the absorption coefficient is of the order of 1,000–5,000 cm$^{-1}$ under an unannealed condition, so that a length of only about 10–20 $\mu$m is sufficient.

Accordingly, in the case of the above-described embodiment of the present invention, total length of the optical obstacle region 122 is preferably selected in the range of 50–150 $\mu$m, and more preferably in the range of 80–100 $\mu$m. When the interval La between the obstacle regions 122 is equal to the stripe width S, the total length of the obstacle region 122 is selected at 50–100 $\mu$m. In the case of S=5 $\mu$m and La=4 $\mu$m, the total length of the obstacle region 122 could be selected at 30–50 $\mu$m.

Figure 4:
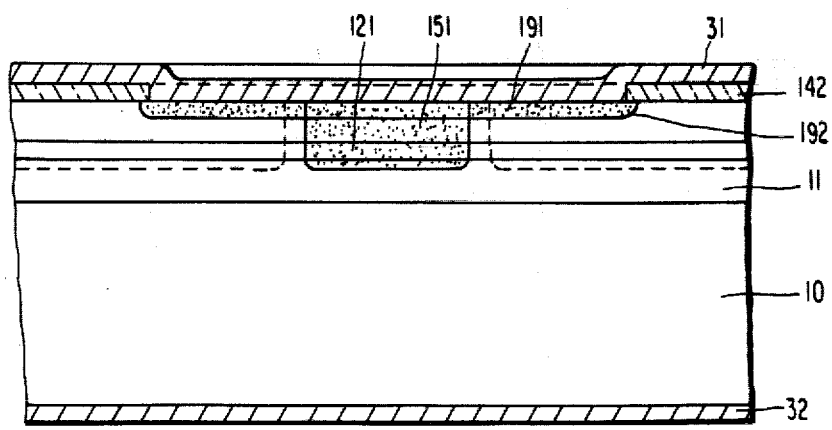
FIG. 4 is a cross-section view similar to FIG. 3B showing a modification of the first preferred embodiment in FIG. 3.

In a more preferred embodiment of the present invention than the above-described first preferred embodiment, after the diffusion process has been completed up to the state shown in FIG. 1, the $SiO_2$ film 14 is removed, a new $SiO_2$ film 142 is applied onto the n-$Al_{0.3}Ga_{0.7}As$ layer 13, openings of 15 $\mu$m in width and 250 $\mu$m in length are formed in the newly applied $SiO_2$ film 142 by well known photo-resist techniques so as to place the above-described stripe-geometry Zn diffusion regions 151 at their center, and Zn is diffused through the new openings to form Zn diffusion regions 191, as shown in FIG. 4. The diffusion front 192 is controlled so as to be located midway of the n-$Al_{0.3}Ga_{0.7}As$ layer 13. In this Zn diffusion process, Zn diffusion is carried out at 600° C., through a closed tube process employing a metallic Zn source to attain a Zn concentration of $2-3 \times 10^{19}$ cm$^{-3}$. As a result, the resistance at an ohmic contact portion can be reduced. In FIG. 4, the transverse width of the Zn diffusion region 191 need not be limited to 15 $\mu$m, but the diffusion region 191 could be formed over the entire extension in the transverse direction provided that the diffusion region 191 does not contact with the optical obstacle region 122, and such an extended structure is a more preferable structure in view of the reduction of the contact resistance. Also, as a matter of course, the optical obstacle region 122 can be formed to have a higher concentration than that of the exciting region 121 through the method of separately carrying out diffusions for the optical obstacle region 122 and the light emitting region 121 without diffusing Zn simultaneously into these regions.

Figure 5:
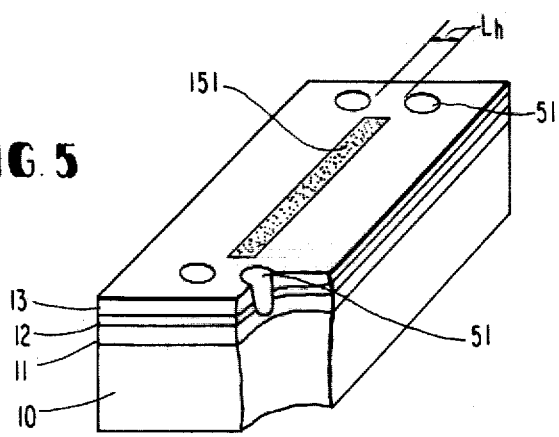
FIG. 5 is a perspective view partly cut away of another preferred embodiment of the present invention.

Referring now to FIG. 5, between a stripe-geometry Zn diffusion region 151 and reflective surfaces 53 are respectively provided window regions having a length of 100 μm. On the opposite sides of each window region are provided deeply engraved bores 51 by etching (chemical etching or ion etching). In the window region, a width $L_h$ of a gap space between the bores 51 is equal to 4 μm. Since the bore 51 is not contacting the stripe geometry exciting region 151, a cause of deterioration would not arise. On the other hand, in the structure in which the window region does not exist, catastrophic optical damage in pulsed operation would occur at about 50 mW and a stable CW operation at room temperature is limited to 5 mW.

In the embodiment illustrated in FIG. 5, the position of the bore 51 could be such that the bore 51 is located in contact with the reflective surface 53. In this case, the portion of the reflective surface contacting with the bore loses the reflection capability in a resonator. In other words, in the place of the bores the reflective surface portions other than the passage of a laser light could be destroyed.

Figure 6:
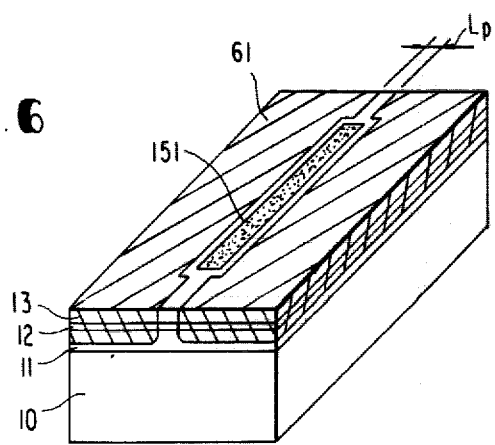
FIG. 6 is a perspective view showing still another preferred embodiment of the present invention.

FIG. 6 shows a still another preferred embodiment of the present invention, in which proton irradiation is effected deeper than the active layer by means of a mask prepared by photo-resist techniques. More particularly, proton-irradiated regions 61 having a high resistance and a high optical absorption coefficient are provided except for the Zn diffusion region 151 and its immediate vicinity and a laser light passageway having a width $L_p = 4$ μm.

It is obvious that the effect of the present invention can be achieved even with the laser structure shown in FIG. 6. Since the proton-irradiated regions exist fairly near to the Zn diffusion region 151, oscillation in the region other than Zn diffusion region 151 would hardly occur.

Even if the proton-irradiated region 61 in FIG. 6 is formed into a mesa structure by etching, the same effect would be attained.

While the present invention has been described above in connection with various preferred embodiments thereof in which optical obstacle regions 122 are formed at four positions in total on the opposite sides of the respective window regions, a modified structure could be employed in which a pair of optical obstacle regions are provided on the opposite sides of one window region, and further it is obvious that the higher order mode suppression effect can be achieved also by providing the obstacle regions on the right side only of one window region and on the left side only of the other window region.

In addition, for pulsed operations the active layer could be thickened to an equivalent thickness as is the case with existing methods for manufacture. In order to form the window regions, diffusion of sulphur (S), which is a n-type impurity, could be employed to expand a band gap of the non-exciting region. Also, both the light emitting region and the window regions could be formed by ion injection without being limited to diffusion.

While the invention has been described above with respect to (Al.Ga)As double heterojunction lasers, the invention is equally applicable to various crystalline materials such as InGaAsP-InP, GaAsSbAlGaAsSb, etc. Of course, it is necessary that an effective band gap of a light emitting region is relatively small will respect to that of the window regions, and hence, whether a p-type crystal is used or a n-type crystal is used is determined depending upon the crystalline material. Also, appropriate protective films such as $Al_2O_3$, $SiO_2$ or C may be provided on the reflective surfaces in order to improve environmental durability. The reflecting power could be controlled by varying the thickness of the protective film.

We claim:

1. A semiconductor laser comprising a semiconductor crystal having a pair of principal surfaces, a first, second, third and fourth side surfaces, said first and second side surfaces being optically reflective and constituting an optical resonator, said third and fourth side surfaces respectively crossing with said first and second side surfaces and being opposing to each other, and a pair of electrodes, said semiconductor crystal including an active layer bounded by a pair of heterojunction interfaces and said first and second side surfaces, said active layer having an elongated exciting region between said first and second side surfaces in a stripe-geometry, one and the other ends of said exciting region being spaced apart from said first and second side surfaces, respectively, said pair of electrodes being provided on said pair of principal surfaces so as to supply injection current to said exciting region via said heterojunction interfaces to emit a light, said active layer further having non-exciting regions locating at least between said one end of said exciting region and said first side surface and between said other end of said exciting region and said second side surface and being transparent to said light emitted from said exciting region, the band gap of said exciting region being narrower than that of said non-exciting region, said crystal further including optical obstacles located at least between said non-exciting regions and said third side surface and between said non-exciting regions and said fourth side surface.

2. The semiconductor laser as recited in claim 1, wherein said exciting region is located in the center of a large but shallow diffusion region, said diffusion region being separated from said optical obstacles.

3. The semiconductor laser as recited in claim 1, wherein said exciting region and said optical obstacles are simultaneously formed by diffusion of an impurity.

4. The semiconductor laser as recited in claim 1 or 2, wherein said optical obstacles are deeply engraved bores.

5. The semiconductor laser as recited in claim 1 or 2, wherein said optical obstacles are proton-irradiated regions having a high resistance and a high optical absorption coefficient.

6. A stripe-geometry heterostructure semiconductor laser comprising a semiconductor crystal having a pair of principal surfaces and a pair of reflective side surfaces constituting an optical resonator, a pair of electrodes, and an insulative layer having an opening, said semiconductor crystal including a semiconductor substrate having a first electrical conductivity type and first, second and third semiconductor layers successively grown on said substrate, said first and third layers having wider band gap than that of said second layer with heterojunction interfaces thereby formed between the first and second layers and between said third and second layers, said crystal further including an elongated diffusion region between said reflective side surfaces in a stripe-geometry, said diffusion region being spaced apart from said reflective side surfaces and formed from one of said principal surfaces of said crystal so as to selectively reduce the band gap of said second layer, said insulative layer being provided on said one principal surface of said crystal with said opening aligned with said diffusion region in a stripe-geometry, one of said electrodes being provided on said one principal surface of said crystal through said opening of the insulative layer and the other of said electrodes being provided on the other principal surface of said crystal, said crystal further including optical obstacles for impeding higher order horizontal transverse mode oscillation of light located at least at corners of said crystal in the vicinities of the elongated ends of said diffusion region.

* * * * *